(12) United States Patent
Matsudate et al.

(10) Patent No.: US 7,990,059 B2
(45) Date of Patent: Aug. 2, 2011

(54) ORGANIC ELECTROLUMINESCENCE DISPLAY DEVICE

(75) Inventors: Noriharu Matsudate, Kujukuri (JP); Hironori Toyoda, Mobara (JP)

(73) Assignee: Hitachi Displays, Ltd., Chiba-ken (JP)

( * ) Notice: Subject to any disclaimer, the term of this patent is extended or adjusted under 35 U.S.C. 154(b) by 1055 days.

(21) Appl. No.: 11/711,047

(22) Filed: Feb. 27, 2007

(65) Prior Publication Data

US 2007/0200497 A1    Aug. 30, 2007

(30) Foreign Application Priority Data

Feb. 27, 2006   (JP) .................. 2006-051333

(51) Int. Cl.
*H01L 51/50* (2006.01)
*H01L 51/52* (2006.01)

(52) U.S. Cl. .......... 313/512; 313/506; 313/509
(58) Field of Classification Search .......... 313/500–512
See application file for complete search history.

(56) References Cited

U.S. PATENT DOCUMENTS

| 6,967,439 B2 * | 11/2005 | Cok et al. .......... 313/512 |
| 2003/0155861 A1 * | 8/2003 | Nishizawa et al. .......... 313/512 |
| 2005/0285520 A1 * | 12/2005 | Cok .......... 313/512 |

* cited by examiner

*Primary Examiner* — Mariceli Santiago
(74) *Attorney, Agent, or Firm* — Stites & Harbison, PLLC; Juan Carlos A. Marquez, Esq.

(57) ABSTRACT

The strength of the whole OLED is increased by proposing a new method of fixing OLED panels. To address the problem, an OLED element is formed on a substrate, and a sealing substrate of a structure by which the substrate is sealed is fixed to a lower metallic frame via an elastic sheet. Silicon resin is preferably used as the sheet, and use of a sheet having a heat diffusion function based on radiation is more desirable.

2 Claims, 12 Drawing Sheets

MECHANISM OF INFRARED ABSORPTION
AND ELASTIC (BUFFER) FILM

FIG.6 EXAMPLE OF POSITIONAL DEVIATION IN A DOWELING PART

OCCURRENCE OF POSITIONAL DEVIATION

PEEL STRESS SUPPRESSING MECHANISM OF FPC

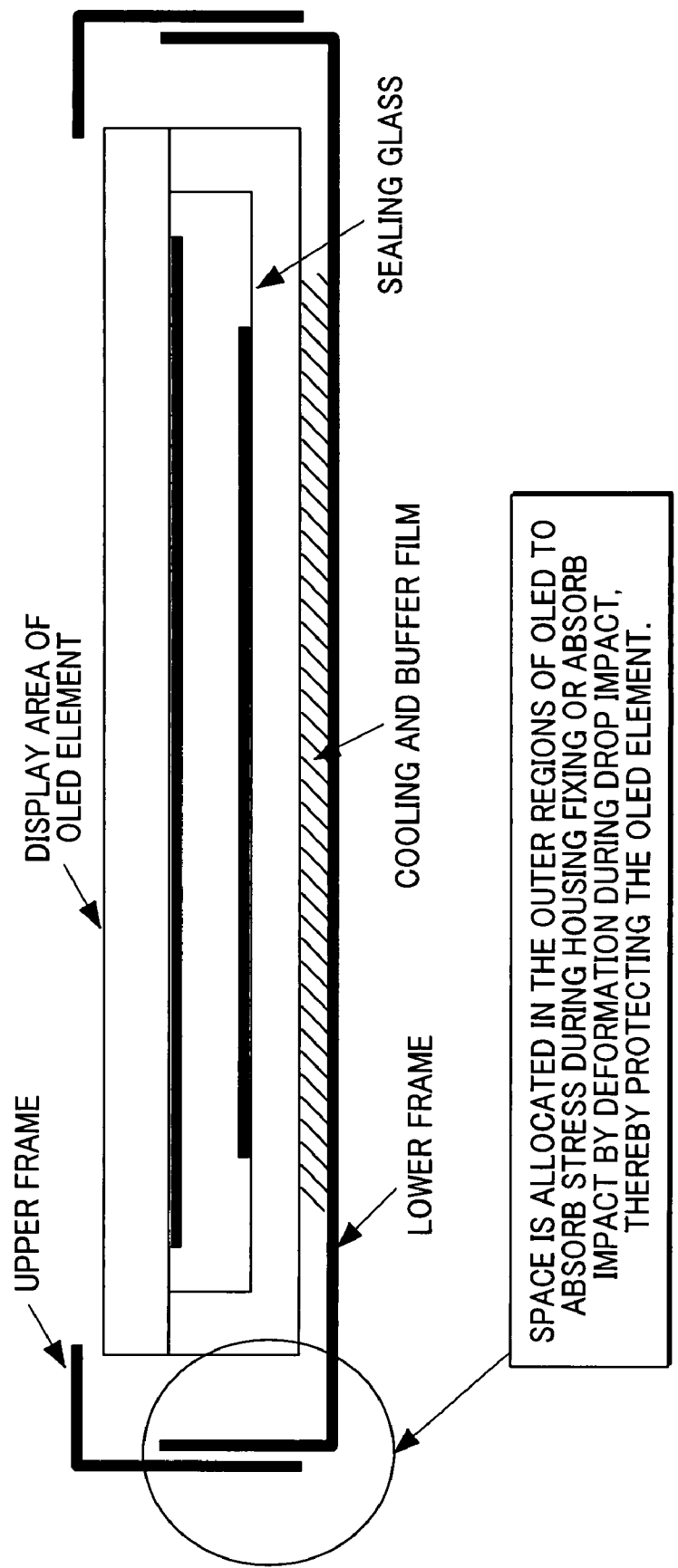

ORGANIC ELECTROLUMINESCENCE DISPLAY DEVICE

CLAIM OF PRIORITY

The present application claims priority from Japanese Application JP 2006-051333 filed on Feb. 27, 2006, the content of which is hereby incorporated by reference into this application.

BACKGROUND OF THE INVENTION

1. Field of the Invention

The present invention relates to the housing structure of an organic EL display device.

2. Description of the Related Art

As one of display devices, an organic EL display device (hereinafter referred to as OLED) has the following characteristics:

1. A display element constituting the OLED is a self light emitting element that does not require backlight.
2. Wide viewing angle and high visibility
3. The high response speed enables high-quality display without difference between moving images and static images.
4. Direct-current, low-voltage driving is enabled.

Therefore, the OLED is expected to contribute to applications for mobile/portable equipments having severe power requirements, and making television and notebook size personal computers thin and light in weight. In the present situation, since there are a small number of commercially available products provided with the OLED, the housing structures of OLEDs, including those that use resin frames for LCD panel, are classified as follows.

(1) Bonding the OLED to frames and fixing the upper and lower frames by circular dowels (spherical projections)

(2) Fixing resin frames for LCD to the OLED

Because of the structure that a display element constituting the OLED is a self light emitting element, since backlight in a liquid crystal display device (LCD) is not required, the OLED also does not require resin mold parts supporting the backlight structure, it has product advantages such as thin size, light weight, and low costs.

The method described in (1) has the following problem. That is, although double-faced tape is usually used for this kind of fixing, since sticking the double-faced tape to an OLED element requires adhesive or the like, the adhesive inevitably deteriorates with time, and there is a problem of reliability attributable to deterioration in the adhesive due to heat generation. In the fixing of the upper and lower frames, because of engagement assembly by circular dowels, both assembly precision and assembly rigidity are low because of slip in engagement portions of the dowels.

The method described in (2) also has the following problem. That is, although the rigidity of the element can be obtained by fixing to a resin mold, dies for manufacturing the resin mold are more expensive than those for metallic frames. To obtain higher rigidity by the resin mold, a display element becomes thicker as a whole, and its external size becomes larger, greatly reducing attraction of a product.

An OLED of the bottom emission method has the following problem. That is, the OLED of the bottom emission method has connection terminals of a flexible printed circuit substrate (FPC) and the like in the reverse side of the light emitting surface of a display element. Therefore, when the OLED has been placed in the housing, since flat cables of the FPC and the like, when connected to a driving circuit, are bent in the direction that peels the surface of flat cable bonding to the OLED, there is a problem in ensuring reliability.

However, since the OLED is structured to have no resin mold, there is a problem in impact resistance and torsion resistance. Therefore, to ensure the structure reliability of the OLED, a frame structure for maintaining the strength of the OLED is an indispensable factor.

SUMMARY OF THE INVENTION

An object of the present invention is to provide an organic electroluminescence display device that ensures structural reliability of the OLED.

As a means for addressing the above-described object, an OLED element is formed on a substrate, and a sealing substrate of a structure by which the substrate is sealed is fixed to a lower metallic frame via an elastic sheet. Although the elastic sheet is preferably silicon resin, common double-faced tape is also an effective means because it is elastic. By providing the elastic sheet with a function such as heat diffusion, the reliability of the OLED element can be increased.

Although not a method of fixing an OLED, the following means is available to increase frame strength. That is, a lower frame and an upper frame are provided with an engagement structure (snap fit) having a notch shape to prevent positional deviation in the thickness direction after assembly.

By designing the snap fit part in each side, positional deviation in thickness direction and vertical direction, that is, lateral direction and rotation direction can be suppressed as the whole frame.

The following structure helps to increase heat radiation effects. That is, by designing wall parts with an upper frame and a lower frame combined apart from OLED panels, impact strength and static load strength can be increased in comparison with an OLED panel unit. Since an air path is formed within an OLED element structure, temperature distribution can be properly maintained, and cooling efficiency is increased.

A slope spring is provided in the lower frame and a support spring is provided in the upper frame. In this case, the height of the joint surface of the upper and the lower springs is designed to be nearer to the light emitting surface than the position of the surface of FPC extraction to the OLED. As a result, in whatever direction flat cables of the FPC and the like are bent, no force occurs in the direction that peels from the surface of bonding to the OLED element. Therefore, the reliability of connection of the flat cables of the FPC and the like to the OLED is increased. By this construction, when the slope spring is provided in the lower frame, the effect of correcting the position in which the OLED is mounted can be obtained. As a result, the precision of OLED mounting position is increased, and positional deviation and inclination of the display surface of the OLED can be precisely manufactured.

According to the present invention, the reliability of the organic EL display device can be increased.

BRIEF DESCRIPTION OF THE DRAWINGS

FIG. 12 is a structural drawing of an OLED panel showing space allocated in the outer regions of OLED.

DETAILED DESCRIPTION OF THE PREFERRED EMBODIMENTS

Hereinafter, preferred embodiments of the present invention will be described in detail with reference to the accompanying drawings.

First Embodiment

Figure 1:
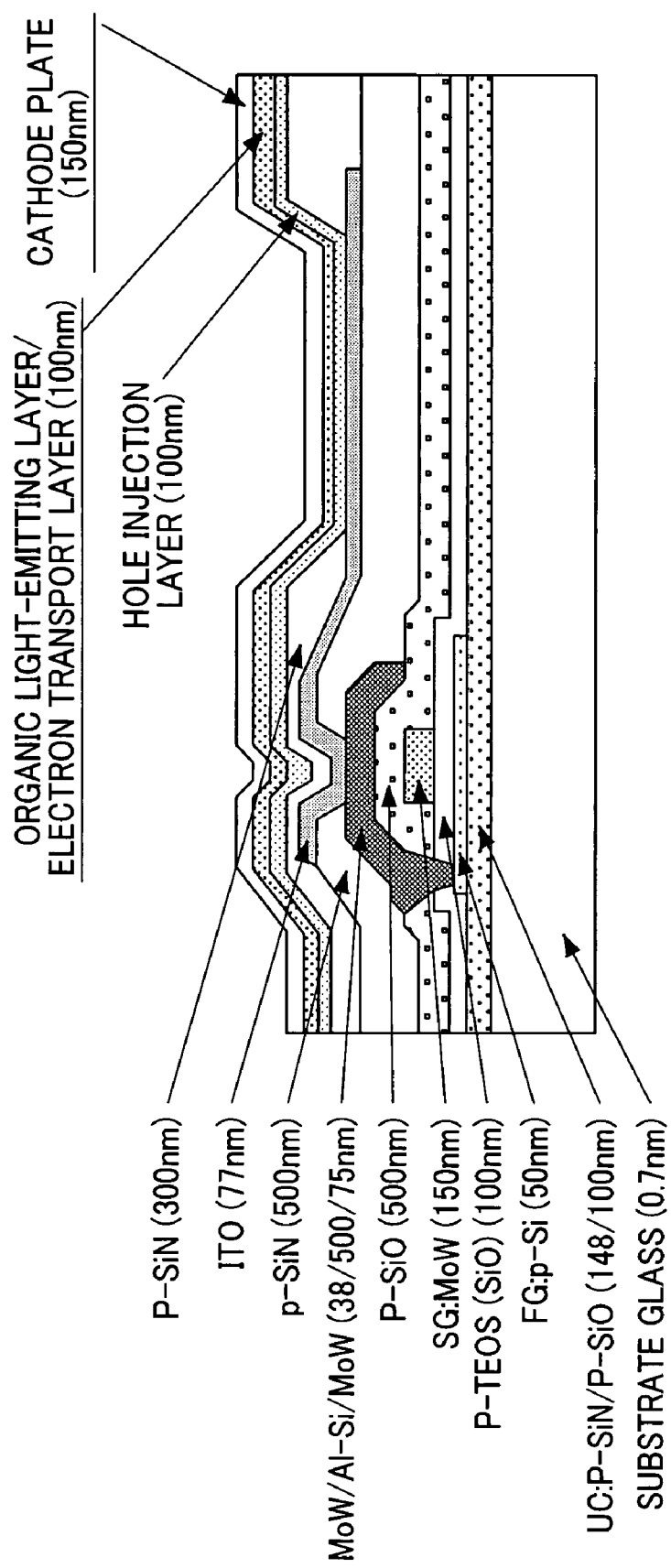
FIG. 1 shows a sectional structure of a general OLED.

FIG. 1 shows a sectional structure of a general OLED. Since the OLED shown in FIG. 1 has a structure conventionally know, a detailed description of it is omitted. In FIG. 1, a light emitting surface is in a lower side, and an organic light-emitting layer and a cathode metal are formed via an optically transparent multilayer film about 1 μm from a substrate glass. This structure is called an OLED of a bottom emission method. An OLED of this structure generally has a desiccant and an empty wall in the reverse side of a light emitting part, and is sealed by a sealing glass (or metal such as a sealing can) from external atmospheres.

Figure 2:
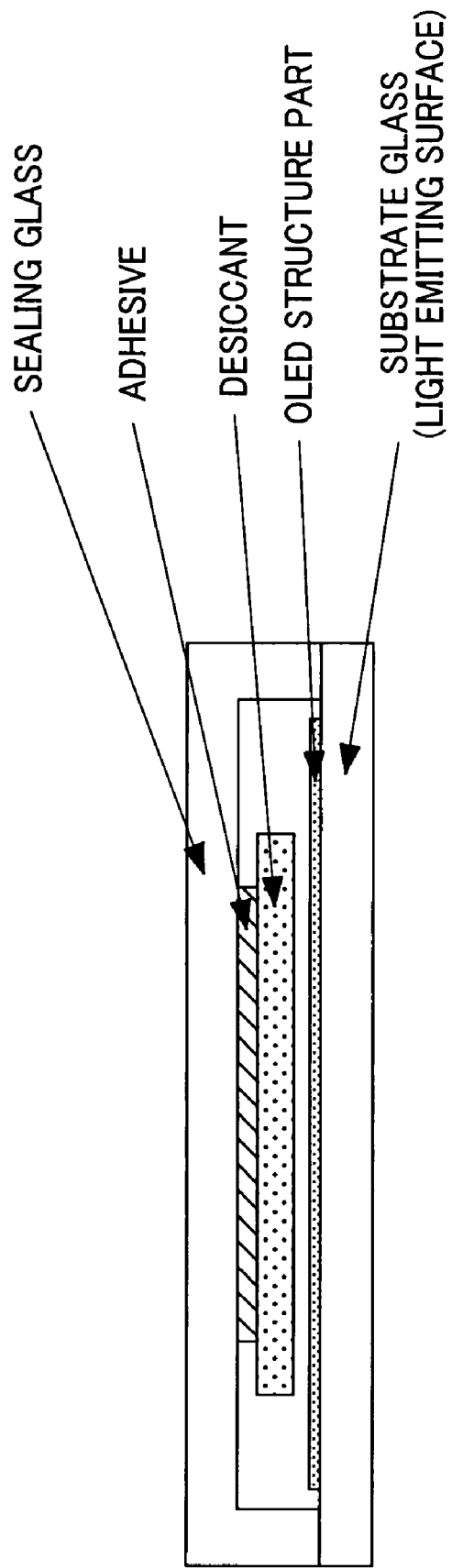
FIG. 2 shows a sectional structure of an OLED sealed by a sealing glass substrate.

FIG. 2 shows a sectional structure of the OLED sealed by a sealing glass substrate. In the OLED sectional structure shown in FIG. 2, air tightness is maintained by the empty wall (generally space filled with nitrogen), the desiccant, and the sealing glass to extract heat generated in a structure part of the OLED from the back surface of the light emitting surface. The whole thickness of the OLED with the substrate glass and the sealing glass laminated is about 1.0 mm, and the existence of the empty wall within a display element poses the problem of maintaining strength against stress and impact from the outside.

<1. Making OLED Frames Highly Rigid>

Figure 3:
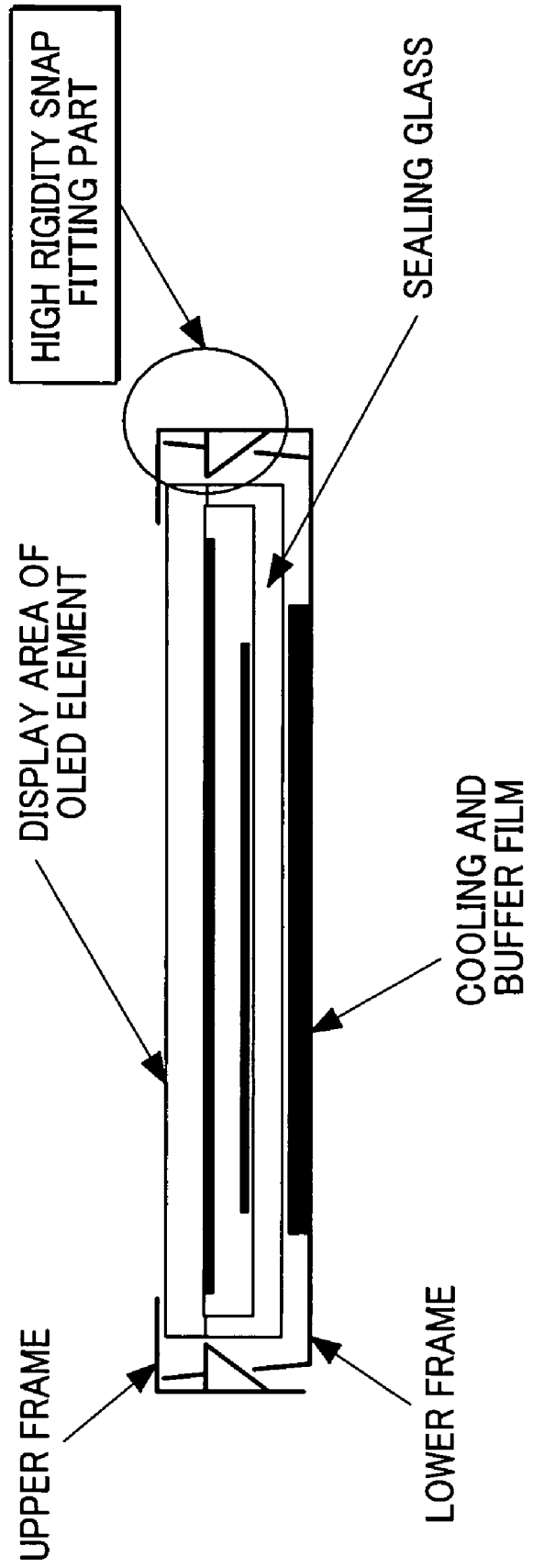
FIG. 3 is a structural drawing of an OLED element of the present invention that uses a frame structure.

As a countermeasure against stress and impact from the outside, an OLED element structure having a frame structure as shown in FIG. 3 to achieve high rigidity has been developed. When a snap fitting part shown in FIG. 3 is enlarged, it will be appreciated that an assembly section of an upper frame and a lower frame forms a truss structure (triangular section). This is a characteristic of this proposal. The truss structure is a building method known conventionally in terms of structural mechanics as a set of triangular shapes designed on side walls to improve the strength of bridges. In recent years, a set of triangular sections, a so-called truss structure, is used as a design method for obtaining the strength of ceiling structure of large-scale dome facilities.

Figure 4:
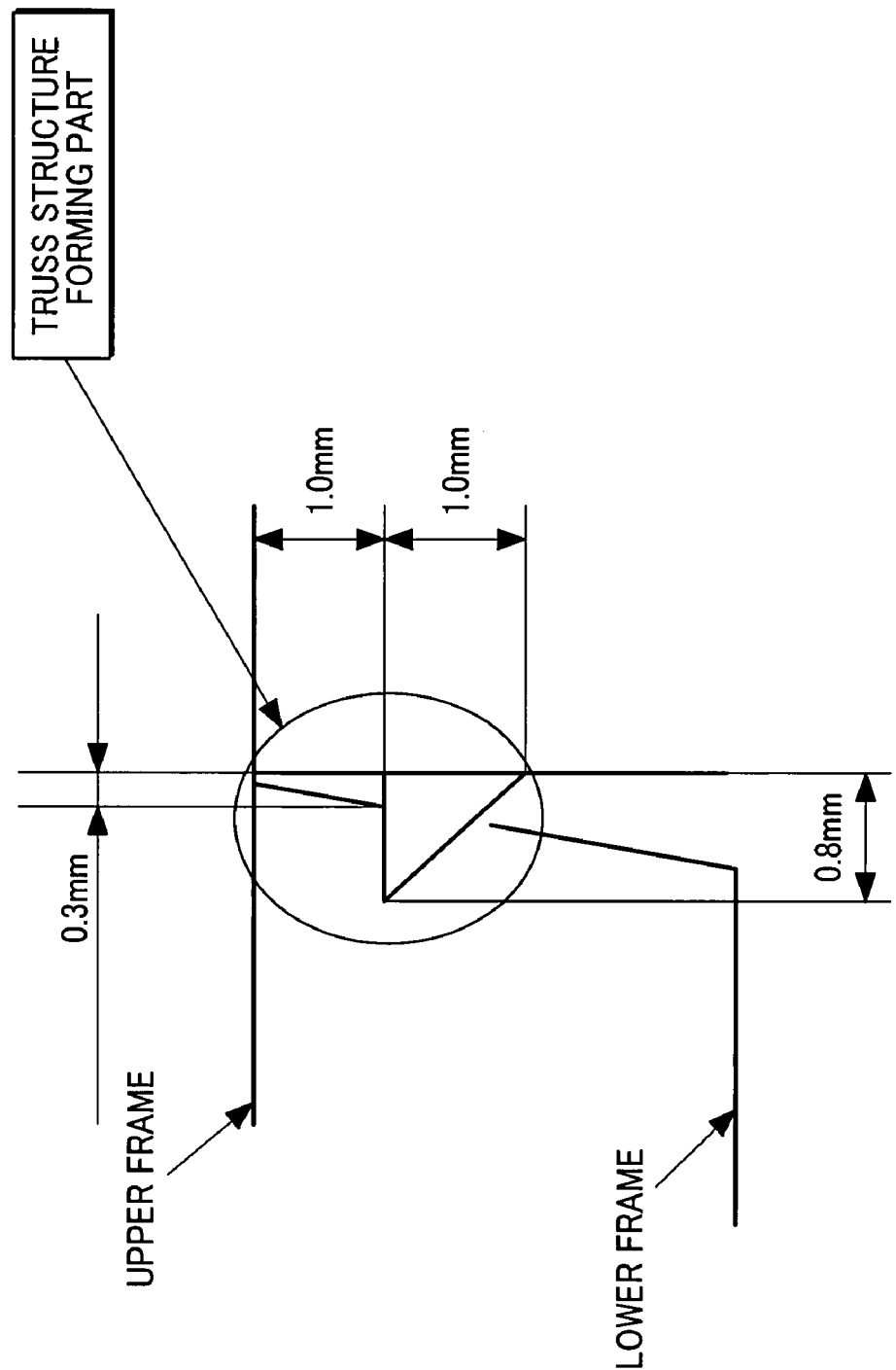
FIG. 4 shows a truss structure part of this proposal.

FIG. 4 shows a truss structure part of this embodiment. By designing such a truss structure (triangular sectional shape) on frame sides, when stress is applied in the direction of compression from a vertical direction of FIG. 4, elements on each side of a triangular section by the truss structure disperse the stress in a direction of compression or extension. As a result, compression rupture strength increases about four or more times in comparison with when frames are simply combined.

<2. Making OLED Frames Highly Precise>

As shown in FIG. 4, a joint part of the truss structure is designed to support a side of a lower frame at an about horizontal support angle at one side of a triangular element designed on an upper frame. Therefore, in FIG. 4, downward positional deviation of the lower frame will not occur. Furthermore, upward positional deviation of the lower frame will not occur because of the constraint of the thickness of an OLED panel and the existence of the vertex parts of truss structure, that is, contact parts between bending parts of the upper frame and edges of the lower frame. As a result, assembly precision of fitted portions increases, so that manufacturing precision as the whole OLED panel increases.

Figure 5:
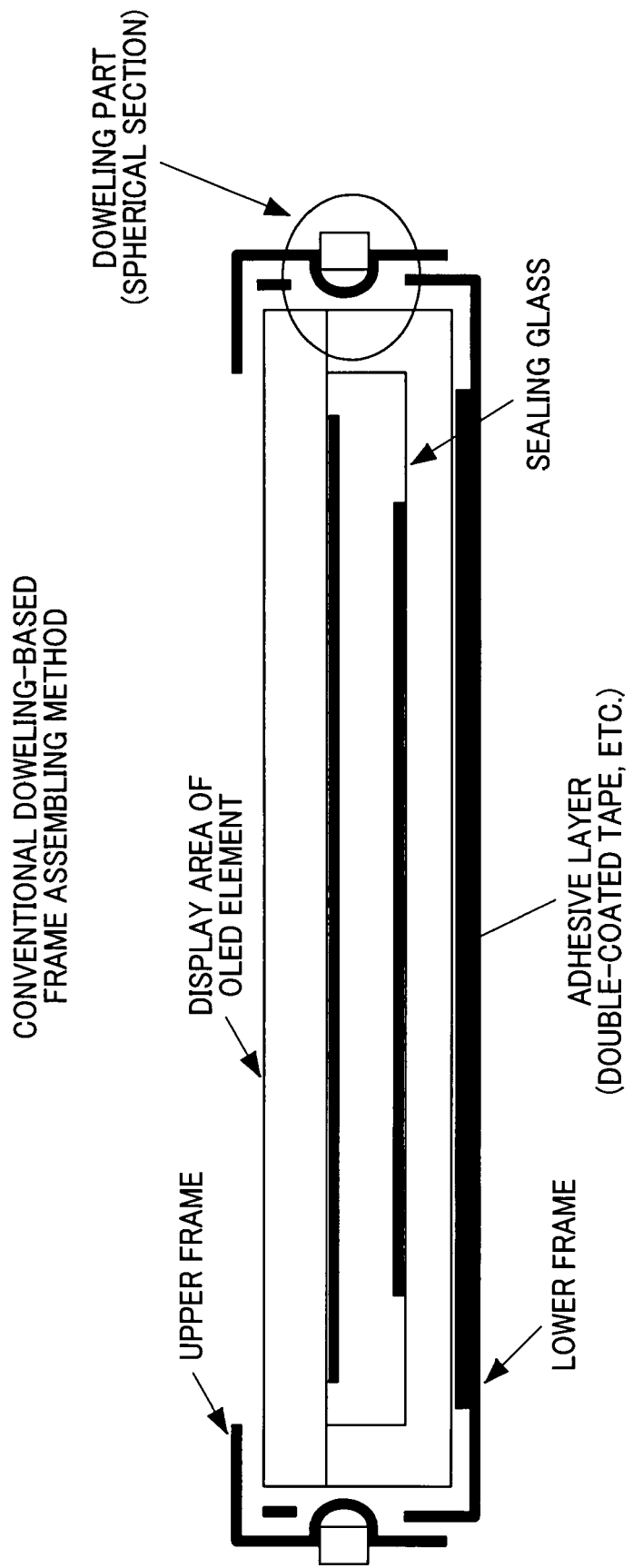
FIG. 5 shows a conventional doweling-based frame assembly method.
Figure 6:
FIG. 6 shows an example of positional deviation in a doweling part.

On the other hand, with metallic frames of a conventional doweling (spherical section) method, since positional deviation occurs readily in a doweling part, assembly precision is very low (see FIGS. 5 and 6).

<3. Problem Peculiar to OLED of Bottom Emission Method>

Figure 7:
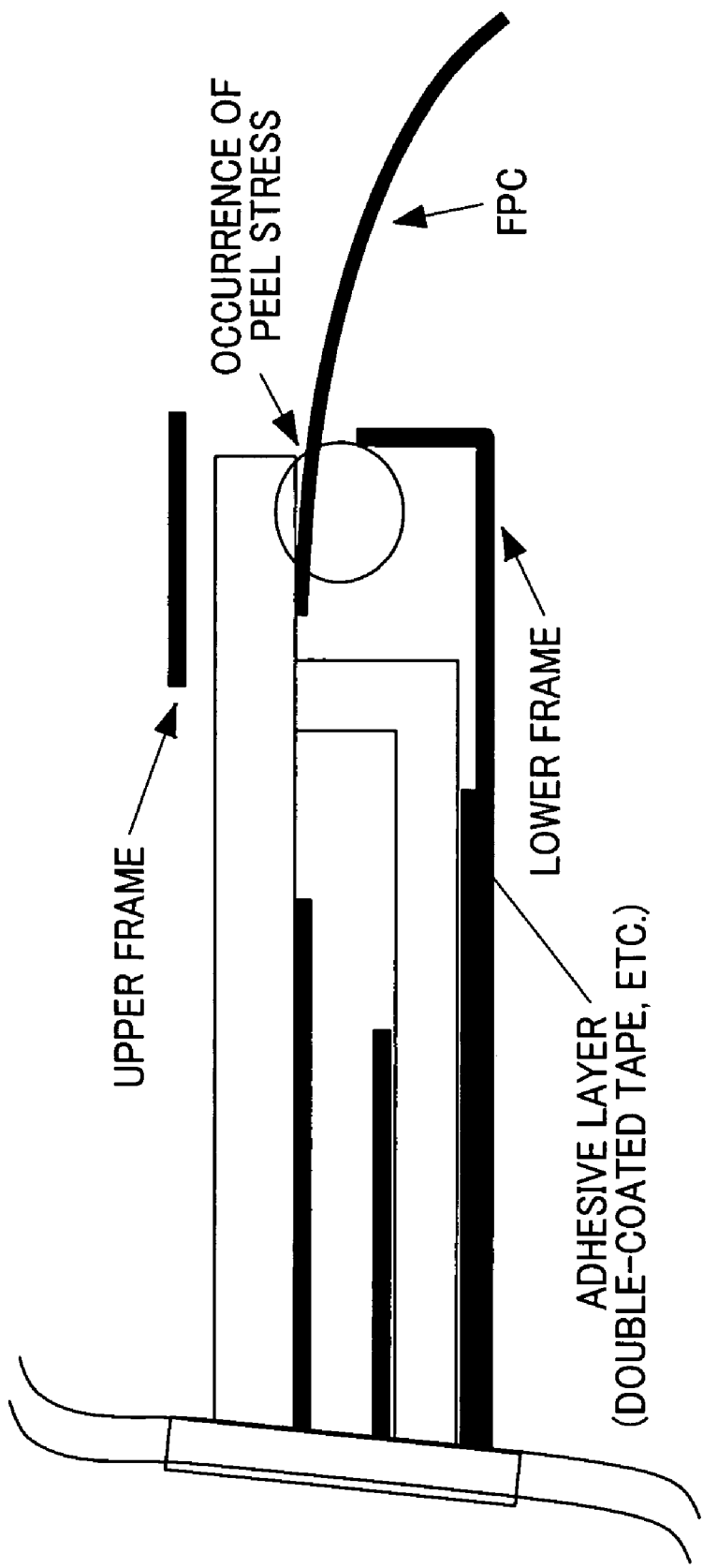
FIG. 7 is a drawing showing FPC peel stress induced by FPC bending.

An OLED of bottom emission method has a structure that a connection surface of flat cables of FPC and the like for OLED elements exist at the reverse side of a light emitting surface. Therefore, when handling an OLED module, depending on the direction that bends the FPC, stress may occur in the direction that peels the FPC from the OLED elements. See FIG. 7. Therefore, one conceivable idea is to reinforce a connection portion between the OLED elements and the FPC. However, in this proposal, a countermeasure is taken against stress in a peel direction acting on the connection portion between the OLED elements and the FPC by designing a support spring mechanism in the upper and the lower frames.

Figure 8:
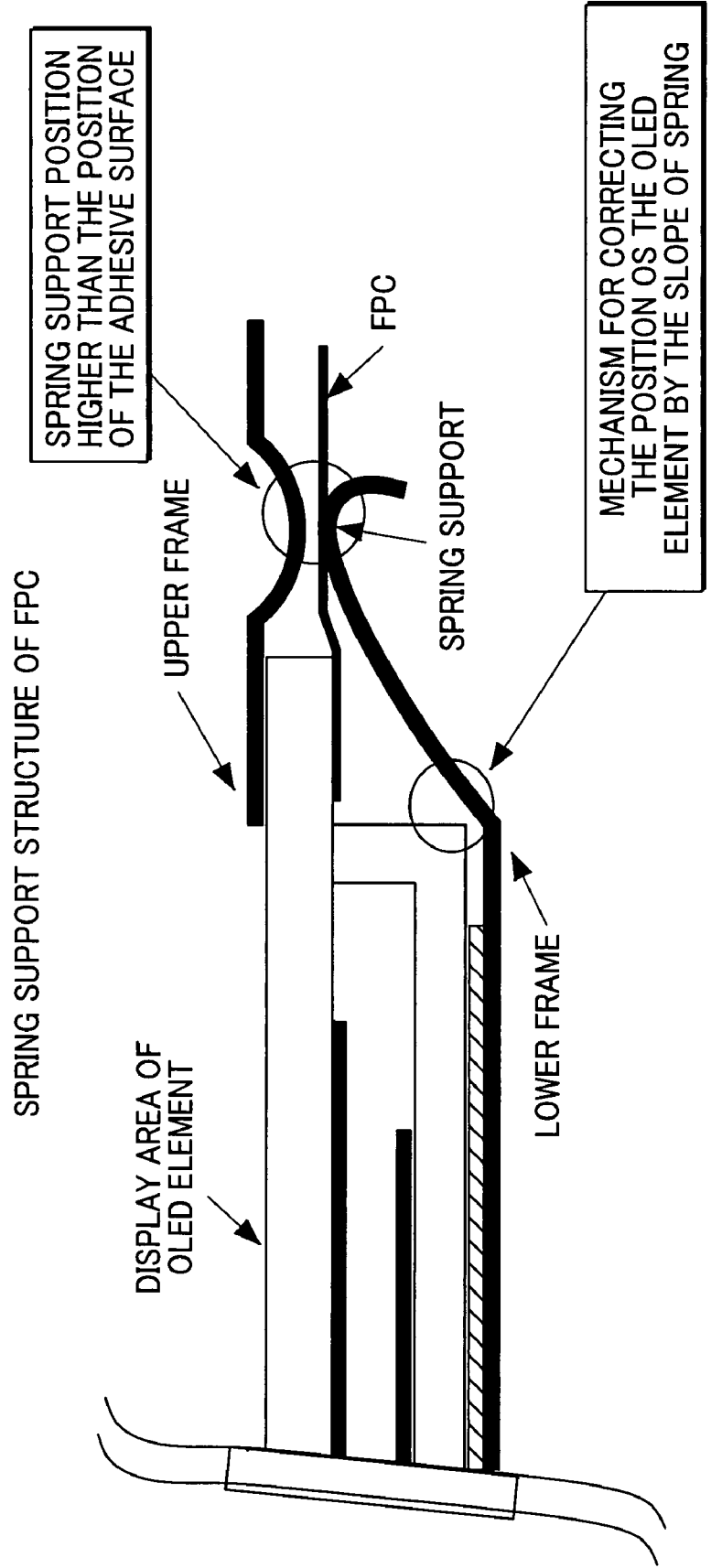
FIG. 8 shows the spring support structure of FPC.
Figure 9:
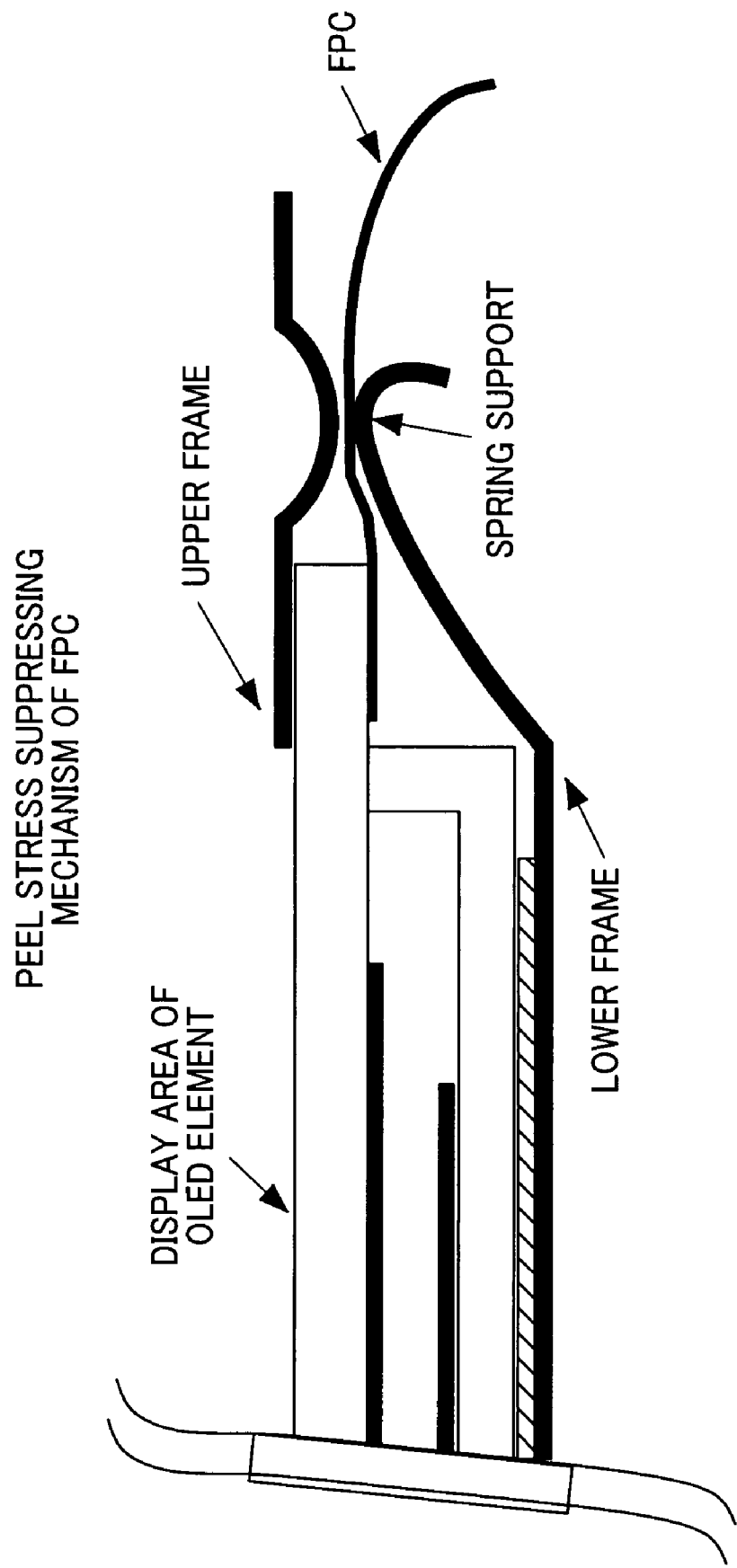
FIG. 9 shows a peel stress suppressing mechanism of FPC.

Furthermore, by providing a gradual inclination for the support spring designed in the lower frame, it becomes possible to provide a self-alignment mechanism for mechanically correcting a positional deviation when fixing the OLED elements to the frame, contributing to an increase in assembly precision as an OLED module structure (see FIGS. 8 and 9).

<4. Stress Buffering Mechanism when Bending Stress is Applied>

Figure 10:
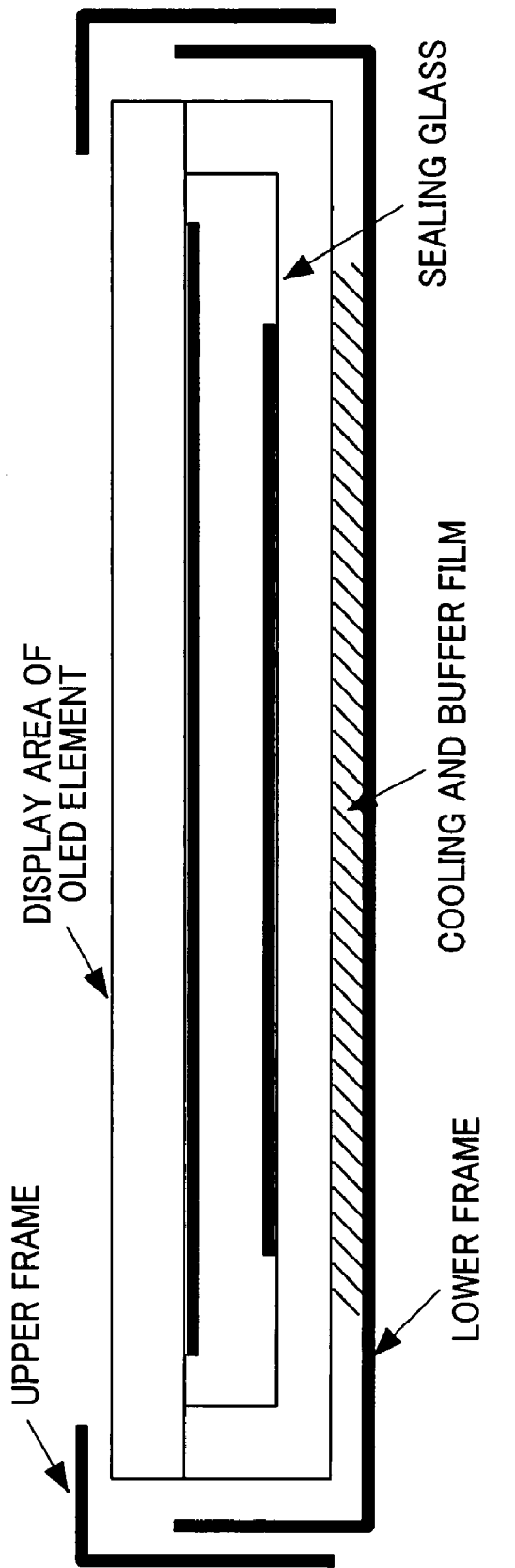
FIG. 10 shows a mechanism of infrared absorption and an elastic (buffer) film.
Figure 11:
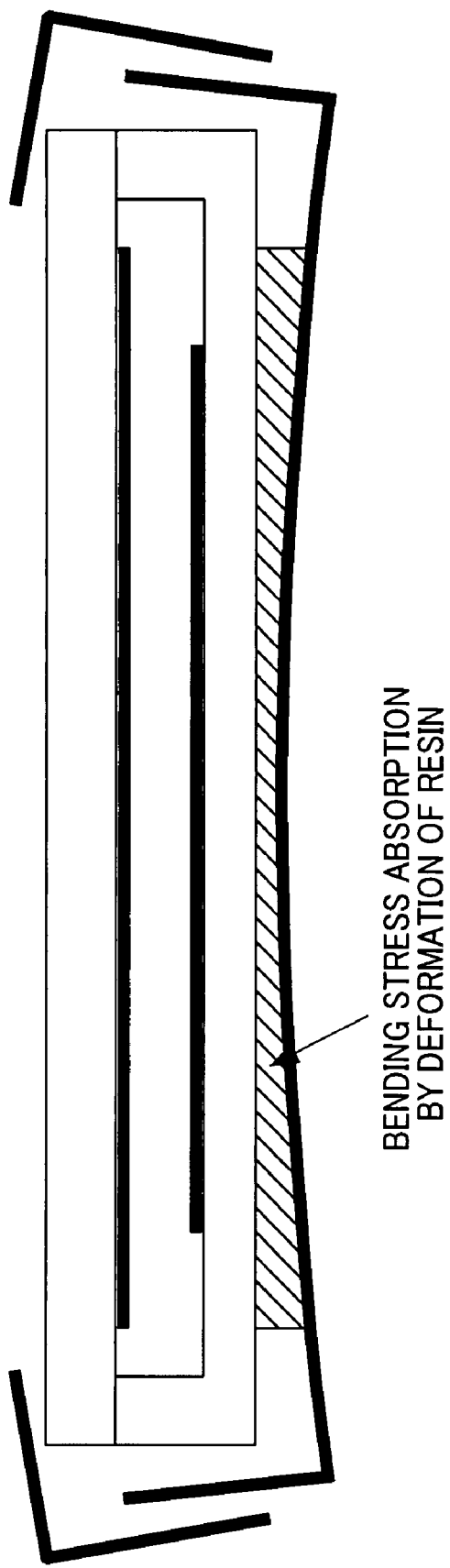
FIG. 11 shows a bending stress absorbing mechanism by an elastic (buffer) film.

With consideration to the handling of a delivered product and actual use states in a final customer, it is necessary to make a design for the application of accidental impact and stress. In this embodiment, an elastic special film, a silicon resin film 0.2 mm thick, is used when an OLED is fixed to a lower frame. As a result, even when the frame is bent with bending stress applied to an OLED module, it has become possible that the elastic film buffers the stress to protect the OLED elements. In comparison with a conventional method of fixing by double-faced tape, as tolerance for bending stress, bending rupture strength by the elastic film stands at 250 or more against 100 for bending rupture strength by double-faced tape, indicating a significant increase in strength (see FIGS. 10 and 11).

Furthermore, by allocating a space between the OLED and the inner wall of the frames by a predetermined amount or more, ideally 50% or more of-the whole thickness of the OLED, when impact by drop or the like is applied from the outside, the impact is absorbed to buffer the impact, or the space portion is deformed to absorb the impact, resulting in the prevention of the OLED elements from destruction. Stress occurring when the OLED module is fixed to a housing in a customer can also be absorbed in the space portion (see FIG. 12).

<5. Heat Diffusion Mechanism of OLED>

Since an OLED is a spontaneous light emitting element, its light emitting operation generates heat. Although the heat generation exerts no influence on reliability in room temperature environments, an increase in temperatures caused by heat generated in the OLED must be minimized in severely hot environments. In this embodiment, by dispersing carbon fillers into an elastic film used when the OLED is fixed to a lower frame, heat generated in the OLED can be efficiently absorbed. The absorbed heat is diffused to the lower frame to dissipate the heat.

In the case of OLED of bottom emission method, in the sectional structure shown in FIG. 2, to extract heat generated in the structure part of the OLED from the back surface of the light emitting side, the heat must be received across the empty wall (generally space filled with nitrogen), the desiccant, and the sealing glass. According to the heat diffusion mechanism of this embodiment, since a heat transfer mechanism is used that absorbs infrared emission from a heating part of the OLED to the elastic film, heat can be efficiently dissipated even in the OLED of the bottom emission method that has difficulty in cooling. Table 1 shows the specification of an elastic film having a cooling mechanism in this embodiment. Although it is desirable that the elastic film is bonded to the OLED by self welding, use of general adhesive and double-faced tape provides sufficient performance (see FIG. 10).
<Table 1>

TABLE 1

| Embodiment of special heat transfer film | |
| --- | --- |
| Layer configuration | Silicon resin |
| Material | Silicon resin containing carbon filler, infrared absorption ceramic, Ni powder, etc. |

TABLE 1-continued

| Embodiment of special heat transfer film | |
| --- | --- |
| Layer configuration | Silicon resin |
| Remarks | Structure requiring no adhesives because of a mechanism of self welding to glass<br>Heat absorption based on infrared radiation by heat radiation rate of 0.80 or more<br>Heat transfer rate $\geq 1.0$ W/(m·k) |

<6. Cooling Mechanism>

(1) Since glass easily transmits infrared rays, by using a special heat cooling film of this proposal, heat generated in an OLED light emitting part is absorbed by infrared rays across a sealing glass and transferred to a metallic frame.

(2) Although natural silicon resin is low in heat conductivity, heat radiation rate, and the like, the infrared absorption property and heat conductivity are improved by incorporating carbon black fillers and infrared absorption ceramic for increasing a heat radiation rate and Ni powder for increasing heat conductivity into the silicon resin.

(3) By using metallic foil in an upper portion, heat generated in the resin of this proposal is conducted to the outside. In this case, as applications, the heat may be conducted to near metallic housing, or the air may be cooled by exposure to the atmosphere. Table 2 compares an OLED cooling mechanism between a conventional one and the embodiment of the present invention.
<Table 2>

TABLE 2

Comparison of an OLED cooling mechanism between a conventional one and the embodiment of the present invention

| Item | This proposal | Conventional one | Remarks |
| --- | --- | --- | --- |
| Structure | Silicon resin plus metallic frame (sputter film is also available) | AL tape sticking | A sticking surface is the back of OLED. |
| Heat absorption from a light emitting surface | Infrared absorption | Infrared absorption capacity is low because of heat radiation rate of 0.1 or less. | |
| Heat route during infrared absorption Direct heat conduction from sealing glass | No heat resistance layer exists because no adhesive is used, and heat is directly absorbed (conducted) to silicon. | An adhesive layer is resistant to heat (heat cushion), and heat resistance increases. | No heat resistance layer exists because of interface welding. |
| Cooling mechanism for heat conduction to external radiator | Heat is conducted through metallic frames. | Heat is conducted through AL foil. | |
| When atmospheric temperature is higher than elements | Resin between metallic frames and OLED elements serves as heat cushion. | Since an adhesive layer is thin, heat from metallic foil conducts to the elements. | |
| Reliability | The interface welding mechanism will not strip objects once bonded together. | The adhesive layer deteriorates with time because of heat of the elements. | |

TABLE 2-continued

Comparison of an OLED cooling mechanism between a conventional one and the embodiment of the present invention

| Item | This proposal | Conventional one | Remarks |
| --- | --- | --- | --- |
| EMI property | Since conductive substance and dielectric contained in silicon resin have a resistance component and a capacity component, they can absorb electromagnetic radiation. | Since the adhesive layer generally exhibits insulation and has no capacity component, it is inadequate as a countermeasure against EMI. | |

What is claimed is:

1. An organic EL display device, comprising:

an OLED panel, wherein an OLED element is formed on a substrate, and a sealing substrate of a structure by which the substrate is sealed, a lower metallic frame having a flat inner surface and walls, the sealing substrate is fixed to the flat inner surface of the lower metallic frame via an elastic sheet of silicon resin, the elastic sheet is not existing between the sealing substrate and the wall of the lower metallic frame, and wherein the gap between the sealing substrate and the wall of the lower metallic frame is bigger than a half of the thickness of the OLED panel.

2. The organic EL display device of claim 1, wherein the elastic sheet is dispersed with carbon black fillers, or infrared absorption ceramic, or Ni powder.

* * * * *